(12) United States Patent
Imaizumi

(10) Patent No.: US 10,191,117 B2
(45) Date of Patent: *Jan. 29, 2019

(54) BATTERY REMAINING POWER PREDICTING DEVICE AND BATTERY PACK

(71) Applicant: ABLIC INC., Chiba-shi, Chiba (JP)

(72) Inventor: Eiki Imaizumi, Chiba (JP)

(73) Assignee: ABLIC INC., Chiba (JP)

(*) Notice: Subject to any disclaimer, the term of this patent is extended or adjusted under 35 U.S.C. 154(b) by 379 days.

This patent is subject to a terminal disclaimer.

(21) Appl. No.: 15/070,151

(22) Filed: Mar. 15, 2016

(65) Prior Publication Data

US 2016/0274193 A1    Sep. 22, 2016

(30) Foreign Application Priority Data

Mar. 19, 2015 (JP) ................... 2015-056461

(51) Int. Cl.
| | |
|---|---|
| *H01M 14/00* | (2006.01) |
| *G01R 31/36* | (2006.01) |
| *H02J 7/00* | (2006.01) |
| *H01M 10/0525* | (2010.01) |
| *H01M 10/48* | (2006.01) |

(52) U.S. Cl.
CPC ..... *G01R 31/3651* (2013.01); *G01R 31/3606* (2013.01); *G01R 31/3655* (2013.01); *G01R 31/3662* (2013.01); *H02J 7/0031* (2013.01); *H01M 10/0525* (2013.01); *H01M 10/486* (2013.01); *H02J 2007/005* (2013.01)

(58) Field of Classification Search
CPC .................. H01M 10/0525; H01M 10/486
See application file for complete search history.

(56) References Cited

U.S. PATENT DOCUMENTS

| | | | |
|---|---|---|---|
| 6,789,026 B2 | 9/2004 | Barsoukov et al. | |
| 6,832,171 B2 | 12/2004 | Barsoukov et al. | |
| 7,425,814 B2 * | 9/2008 | Tsuchiya | G01R 31/3675 320/110 |

* cited by examiner

*Primary Examiner* — Jane J Rhee
(74) *Attorney, Agent, or Firm* — Brinks Gilson & Lione

(57) ABSTRACT

To provide a battery pack capable of performing a highly accurate prediction of a remaining power of a battery while being low in cost. A battery remaining power predicting device includes a voltage detection portion which measures a voltage and a temperature of a battery, a computing portion which predicts and calculates a remaining power of the battery, and a controller which controls the computing portion, and has a battery remaining power predicting flow for regressively calculating the battery remaining power, and a secular change estimating flow for estimating a secular change in battery characteristics, using a case where a battery current is in a constant current state.

11 Claims, 6 Drawing Sheets

BATTERY REMAINING POWER PREDICTING DEVICE AND BATTERY PACK

RELATED APPLICATIONS

This application claims priority under 35 U.S.C. § 119 to Japanese Patent Applications No. 2015-056461 filed on Mar. 19, 2015, the entire content of which is hereby incorporated by reference.

BACKGROUND OF THE INVENTION

Field of the Invention

The present invention relates to a battery pack, and particularly to a battery remaining power predicting device which predicts a battery remaining power of a lithium ion rechargeable battery or the like.

Background Art

A charging battery has been used in a number of devices, starting with a portable device. A battery management system for managing charging/discharging is essential therefor. It is particularly necessary to more accurately recognize the operation time of the charging battery during the device operation. To this end, a battery remaining power predicting device has been used.

A battery pack equipped with a related art battery remaining power predicting device is illustrated in FIG. 7. The related art battery remaining power predicting device 20 is equipped with a CPU 21 which performs a signal processing computation, a RAM 22 used upon the signal processing computation, an ADC 23 for detecting a battery voltage obtained by converting a battery voltage corresponding to one cell of a charging battery 7 by a level translator 26, an ADC 24 for detecting a voltage developed across a current sense resistor 6 for detecting a current of the charging battery 7, and a nonvolatile-memory 25 which holds characteristic data of the charging battery, etc. therein in advance. The battery remaining power predicting device determines the battery remaining power from the voltage of the charging battery 7, a moving charge quantity determined by a coulomb counter from the current value of the charging battery 7 measured using the current sense resistor 6, etc. The high accuracy measurement of the voltage and current of the charging battery 7 is essential for a highly accurate remaining power prediction.

Paying particular attention to the current measurement, there is a demand for the current sense resistor 6 to have a highly accurate resistance value.

[Patent Document 1] U.S. Pat. No. 6,789,026 Specification

[Patent Document 2] U.S. Pat. No. 6,832,171 Specification

SUMMARY OF THE INVENTION

A battery remaining power predicting device measures a battery voltage, a battery current, etc. to carry out a battery remaining power prediction calculation. A battery intrinsic correlation between an open circuit voltage of a charging battery and a charging state SOC indicative of a battery remaining power of the battery is used in the battery remaining power prediction calculation. Further, a remaining power prediction is performed even by measuring a battery current and calculating (coulomb-counting) the quantity of electric charges which flow out from the battery. When an application system is driven by the battery, a voltage different from the battery open circuit voltage is outputted as a battery output voltage due to the influence of a battery internal impedance.

Thus, since it is not possible to measure an accurate battery open circuit voltage at the time of the driving, there have been adopted several methods for estimating the battery open circuit voltage. In conjunction therewith, the total quantity of electric charges which flow out is measured in parallel to carry out the remaining power prediction. To this end, the highly accurate measurement of the battery current is essential, and an expensive sense resistor which is high in accuracy and large in current allowable amount is required for the highly accurate current measurement.

Further, the maximum battery capacity and internal impedance of the battery, which are battery characteristics, change with time as they are used, and the usable battery capacity is gradually reduced. In order to perform the accurate battery remaining power prediction calculation, there is a need to reflect changes in the maximum battery capacity and battery internal impedance on that calculation. There has been proposed a method for measuring or estimating secular changes in the maximum battery capacity and battery internal impedance.

The measurement of the battery current is essential for a measurement method. Thus, a deterioration model using the dependence of battery characteristics on the number of charging and discharging cycles, etc. is used in a remaining power predicting device which performs a remaining power prediction from only a battery terminal voltage value. A problem, however, arises in that since the condition of a secular change greatly depends on a method to use the battery, difficulty occurs in predicting accurate deterioration, and a battery remaining power prediction calculation error becomes larger as the battery is used.

The present invention provides a high-accuracy remaining power predicting device in which in a remaining power predicting device based on a battery voltage value, a secular change in battery characteristics can be accurately estimated even without performing the measurement of a battery current.

A battery remaining power predicting device of the present invention measures battery characteristics when current consumption is a constant current, and includes a flow for estimating a secular change in battery characteristics.

According to the battery remaining power predicting device of the present invention, a current sense resistor becomes unnecessary. An accurate secular change in battery characteristics can be estimated based on a detected battery voltage. A highly accurate battery remaining power prediction can be done permanently. It is thus possible to provide a battery pack in a small size and at a low cost.

DETAILED DESCRIPTION OF THE PREFERRED EMBODIMENTS

Figure 1:
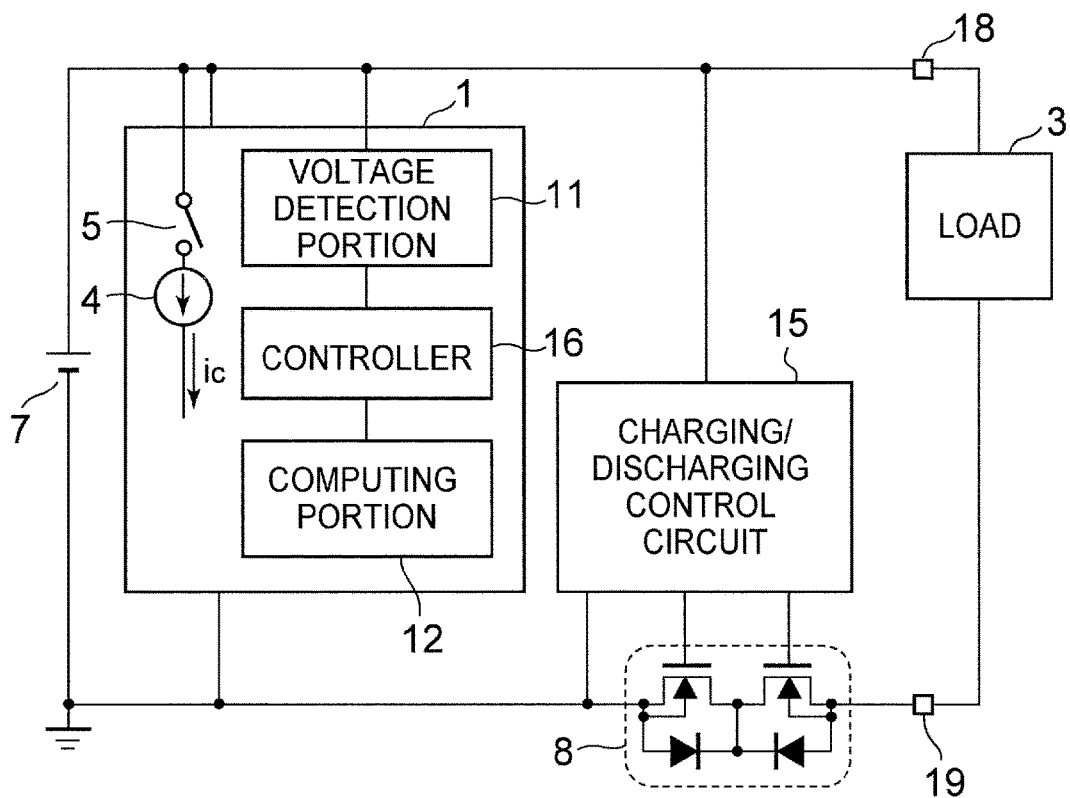
FIG. 1 is a block diagram of a battery pack equipped with a battery remaining power predicting device according to the present embodiment.

FIG. 1 is a block diagram of a battery pack equipped with a battery remaining power predicting device according to the present embodiment.

The battery pack of the present embodiment is equipped with the battery remaining power predicting device 1, a rechargeable battery 7, a charging/discharging control MOSFET 8, a charging/discharging control circuit 15, and external terminals 18 and 19.

The battery remaining power predicting device 1 is equipped with a voltage detection portion 11, a controller 16, a computing portion 12 which performs a battery remaining power prediction calculation or the like, a constant current source 4, and a switch 5.

The battery pack of the present embodiment is connected as follows. The battery remaining power predicting device 1 is connected across the rechargeable battery 7. The MOSFET 8 is provided to the external terminal 19. The charging/discharging control circuit 15 is connected across the rechargeable battery 7 and has an output terminal connected to the MOSFET 8. An application system which functions as a load 3 is connected to the external terminals 18 and 19. The voltage detection portion 11 has an input terminal to which the rechargeable battery 7 is connected, and an output terminal connected to the controller 16. The controller 16 is connected to the computing portion 12. The constant current source 4 is connected to the battery 7 through the switch 5.

The constant current source 4 is connected as a load of the battery 7 through the switch 5. The voltage detection portion 11 detects a terminal voltage of the rechargeable battery 7 and outputs the same to the controller 16. The controller 16 and the computing portion 12 highly accurately perform a prediction calculation on the battery remaining power of the rechargeable battery 7, based on information obtained from the voltage detection portion 11. A highly accurate battery remaining power prediction computation is executed in the controller 16 and the computing portion 12. Further, a battery characteristics secular change estimating flow for highly accurate remaining power prediction is executed.

The present invention provides the battery remaining power predicting device 1 having a method for accurately estimating a secular change in battery characteristics in order to accurately predict the battery remaining power (charging state SOC) of the battery.

Figure 2:
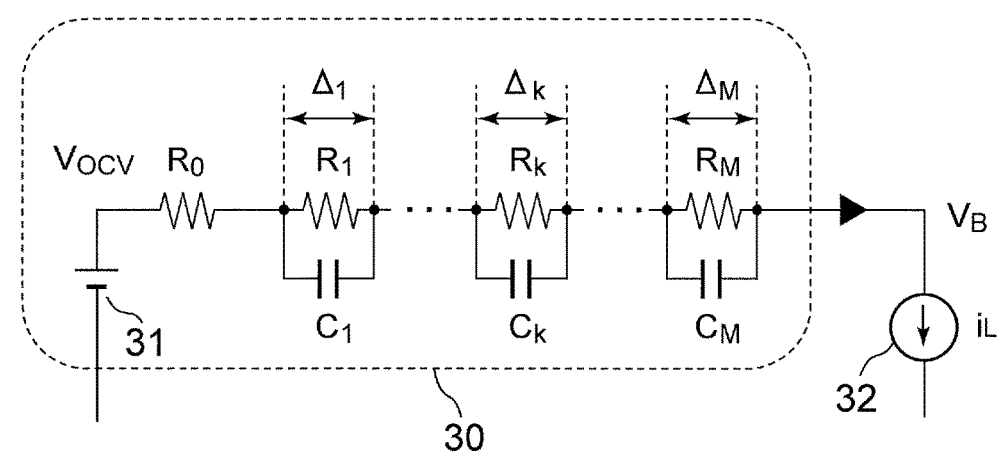
FIG. 2 is a circuit diagram illustrating one example of an equivalent circuit model of a battery.

FIG. 2 is a circuit diagram illustrating an equivalent circuit model of the rechargeable battery 7. The present model is defined in maximum battery capacity $Q_{max}$ and comprised of a voltage source 31 which outputs a battery open circuit voltage depending on the charging state and the temperature of the battery, M sets of C-R parallel circuits connected in series, in each of which a resistor $R_k$ and a capacitor $C_k$ configuring an equivalent circuit of a battery internal impedance are connected in parallel, and a series-connected resistor $R_0$.

The C-R parallel circuits indicate transient response characteristics of an output voltage of the rechargeable battery 7. The number of the C-R parallel circuits to be connected depends on the accuracy of a model to be acquired. The more the number of the C-R parallel circuits to be connected increases, the easier high accuracy becomes. The maximum battery capacity and the battery internal impedance change as the battery is used. Generally, the maximum battery capacity decreases, and the battery internal impedance increases. Therefore, if secular changes in the maximum battery capacity and battery internal impedance are not taken into consideration when performing the battery remaining power prediction calculation, an error in the battery remaining power prediction increases with an elapsed time for battery use. Thus, the changes in these battery characteristics are essential to be measured and estimated.

First, a relational equation indicating the relationship between a battery open circuit voltage Vocv and a battery terminal voltage VB is derived based on the equivalent circuit of the rechargeable battery 7. A differential equation is established with a load current as $i_L$. Assuming that the voltage applied across $R_k$ and $C_k$ which configure the C-R parallel circuit is $\Delta_k$ (where k≥1), a current flowing through each of resistors $R_1$ to $R_M$ is expressed in an equation 1 as $i_{Rk}$:

$$i_{Rk} = \Delta_k / R_k \quad (1)$$

Further, a current flowing through each of capacitors $C_1$ to $C_M$ is expressed in an equation 2 as $i_{Ck}$:

$$i_{C_k} = C_k \cdot \frac{\partial}{\partial t} \Delta_k \quad (2)$$

Since the sum of these currents is equal to the load current $i_L = i_{Rk} + i_{Ck}$, two equations shown below are obtained:

$$i_L \cdot R_k = \Delta_k + R_k \cdot C_k \cdot \frac{\partial}{\partial t} \Delta_k \quad (3)$$

$$V_{ocv} - VB = i_L \cdot R_0 + \sum_{k=1}^{M} \Delta_k \quad (4)$$

When, assuming that the battery characteristics change with time, secular change coefficients of their equivalent circuit parameters $Q_{max}$, $R_k$, and $C_k$ are assumed to be $C_{Qdg}$, $C_{Rdg}$, and $C_{Cdg}$ respectively, the equations 3 and 4 yield two equations shown below:

$$i_L \cdot C_{Rdg} \cdot R_k = \Delta_k + C_{Cdg} \cdot C_{Rdg} \cdot R_k \cdot C_k \cdot \frac{\partial}{\partial t} \Delta_k \quad (5)$$

$$V_{ocv} - VB = i_L \cdot C_{Rdg} \cdot R_0 + \sum_{k=1}^{M} \Delta_k \quad (6)$$

Incidentally, a secular change coefficient "1" means the absence of a secular change.

The load current $i_L$ can be expressed by the following equation, based on a change in the charging state SOC of the battery, the maximum battery capacity $Q_{max}$, and the secular change coefficient $C_{Qdg}$ of the maximum battery capacity. The charging state SOC is expressed by the ratio between the battery capacity and the maximum battery capacity $Q_{max}$ at a certain point of time. Thus, when the battery is in a normal state, the charging state SOC assumes 0≤SOC≤1. When SOC is negative, it is equivalent to an overdischarging state. When SOC exceeds 1, it is equivalent to an overcharging state. Incidentally, the current can be expressed in the following equation with the direction of discharge defined as positive:

$$i_L = -C_{Qdg} \cdot Q_{max} \cdot \frac{\partial SOC}{\partial t} \tag{7}$$

Substituting the equations 5 and 6 into the equation 7 yields equations 8 and 9:

$$-C_{Qdg} \cdot Q_{max} \cdot \frac{\partial SOC}{\partial t} \cdot C_{Rdg} \cdot R_k = \Delta_k + C_{Cdg} \cdot C_{Rdg} \cdot R_k \cdot C_k \cdot \frac{\partial}{\partial t}\Delta_k \tag{8}$$

$$V_{ocv} - VB = -C_{Qdg} \cdot Q_{max} \cdot \frac{\partial SOC}{\partial t} \cdot C_{Rdg} \cdot R_0 + \sum_{k=1}^{M} \Delta_k \tag{9}$$

Now assuming that the product of the secular change coefficients $C_{Rdg}$ and $C_{Qdg}$ is $C_{dg}$, and a secular change in the time constant $R_k \cdot C_k$ of the battery internal impedance is small, the product can be made approximate to $C_{Rdg} \cdot C_{Cdg} \sim 1$. Considering the above, the equations 8 and 9 can be simplified into the following equations:

$$-C_{dg} \cdot Q_{max} \cdot R_k \cdot \frac{\partial SOC}{\partial t} = \Delta_k + C_k \cdot R_k \cdot \frac{\partial}{\partial t}\Delta_k \tag{10}$$

$$V_{ocv} - VB = -C_{dg} \cdot Q_{max} \cdot R_0 \cdot \frac{\partial SOC}{\partial t} + \sum_{k=1}^{M} \Delta_k \tag{11}$$

Assuming that upon solving the present differential equation, the differential equation is approximated by a difference equation described with the time prior to one time as n−1 assuming the time is n and the unit time is $t_C$, the equation 10 yields an equation 12:

$$-C_{dg} \cdot Q_{max} \cdot R_{k,n} \cdot \frac{SOC_n - SOC_{n-1}}{t_C} = \Delta_{k,n} + C_{k,n} \cdot R_{k,n} \cdot \frac{\Delta_{k,n} - \Delta_{k,n-1}}{t_C} \tag{12}$$

Determining $\Delta_{k,n}$ from the equation 12 yields an equation 13:

$$\Delta_{k,n} = \frac{-C_{dg} \cdot Q_{max} \cdot R_{k,n} \cdot (SOC_n - SOC_{n-1}) + C_{k,n} \cdot R_{k,n} \cdot \Delta_{k,n-1}}{t_C + C_{k,n} \cdot R_{k,n}} \tag{13}$$

On the other hand, when the equation 11 is approximated by the difference equation, the equation 11 is expressed as an equation 14:

$$V_{ocv,n} - V_{B,n} = -C_{dg} \cdot Q_{max} \cdot R_{0,n} \cdot \frac{SOC_n - SOC_{n-1}}{t_C} + \sum_{k=1}^{M} \Delta_{k,n} \tag{14}$$

Substituting the equation 13 into the equation 14 yields an equation 15:

$$V_{ocv,n} - V_{B,n} = \tag{15}$$
$$-C_{dg} \cdot Q_{max} \cdot (SOC_n - SOC_{n-1}) \cdot \left(\frac{R_{0,n}}{t_C} + \sum_{k=1}^{M} \frac{R_{k,n}}{t_C + C_{k,n} \cdot R_{k,n}}\right) +$$
$$\sum_{k=1}^{M} \frac{C_{k,n} \cdot R_{k,n} \cdot \Delta_{k,n-1}}{t_C + C_{k,n} \cdot R_{k,n}}$$

By determining a charging state $SOC_n$ at the time n through the equation 15, based on a charging state $SOC_{n-1}$ and $\Delta_{k,n-1}$ at the time n−1 prior to the one time, and a battery terminal voltage $VB_n$ at the time n, a remaining power prediction can be carried out. It is necessary that the secular change coefficient $C_{dg}$ is known upon calculation. Even if the individual secular change coefficients of the maximum battery capacity and the battery internal resistance are unknown, a battery remaining power prediction calculation reflecting the secular changes can be carried out if it is possible to recognize the secular change coefficient corresponding to the product of those.

An equation 16 is obtained as one corresponding to the equation 15 at the next time n+1.

$$V_{ocv,n+1} - V_{B,n+1} = \tag{16}$$
$$-C_{dg} \cdot Q_{max} \cdot (SOC_{n+1} - SOC_n) \cdot \left(\frac{R_{0,n+1}}{t_C} + \sum_{k=1}^{M} \frac{R_{k,n+1}}{t_C + C_{k,n+1} \cdot R_{k,n+1}}\right) +$$
$$\sum_{k=1}^{M} \frac{C_{k,n+1} \cdot R_{k,n+1} \cdot \Delta_{k,n}}{t_C + C_{k,n+1} \cdot R_{k,n+1}}$$

The equation 16 is expressed as an equation 17 when the equation 13 is substituted into $\Delta_{k,n}$:

$$V_{ocv,n+1} - V_{B,n+1} = \tag{17}$$
$$-C_{dg} \cdot Q_{max}(SOC_{n+1} - SOC_n)\left(\frac{R_{0,n+1}}{t_C} + \sum_{k=1}^{M} \frac{R_{k,n+1}}{t_C + C_{k,n+1} \cdot R_{k,n+1}}\right) -$$
$$C_{dg} \cdot Q_{max} \cdot (SOC_n - SOC_{n-1}) \cdot$$
$$\sum_{k=1}^{M} \frac{C_{k,n+1} \cdot R_{k,n+1} \cdot R_{k,n}}{(t_C + C_{k,n+1} \cdot R_{k,n+1}) \cdot (t_C + C_{k,n} \cdot R_{k,n})} +$$
$$\sum_{k=1}^{M} \frac{C_{k,n} \cdot R_{k,n} \cdot C_{k,n+1} \cdot R_{k,n+1} \cdot \Delta_{k,n-1}}{(t_C + C_{k,n+1} \cdot R_{k,n+1}) \cdot (t_C + C_{k,n} \cdot R_{k,n})}$$

Consider where the secular change coefficients are determined using the equation 15 at the time n and the equation 17 at the time n+1. Now, a battery current is assumed to be in a constant state even if a current value is unknown. With this assumption, changes in the battery remaining power at the times n and n+1 can be made equal to each other. That is, they are represented as $SOC_{n+1} - SOC_n = SOC_n - SOC_{n-1}$.

Thus, the equation 17 yields an equation 18:

$$V_{ocv,n+1} - V_{B,n+1} = -C_{dg} \cdot Q_{max} \cdot (SOC_n - SOC_{n-1}) \cdot \left\{\frac{R_{0,n+1}}{t_C} + \tag{18}\right.$$
$$\left.\sum_{k=1}^{M} \left[\frac{1}{t_C + C_{k,n+1} \cdot R_{k,n+1}} \cdot \left(R_{k,n+1} + \frac{C_{k,n+1} \cdot R_{k,n+1} \cdot R_{k,n}}{t_C + C_{k,n} \cdot R_{k,n}}\right)\right]\right\} +$$

-continued $$\sum_{k=1}^{M} \frac{C_{k,n} \cdot R_{k,n} \cdot C_{k,n+1} \cdot R_{k,n+1} \cdot \Delta_{k,n+1}}{(t_C + C_{k,n+1} \cdot R_{k,n+1}) \cdot (t_C + C_{k,n} \cdot R_{k,n})}$$

Rearranging the equations 15 and 18 respectively yield equations 19 and 20:

$$V_{ocv,n} - V_{B,n} - \sum_{k=1}^{M} \frac{C_{k,n} \cdot R_{k,n} \cdot \Delta_{k,n-1}}{t_C + C_{k,n} \cdot R_{k,n}} = \quad (19)$$

$$-C_{dg} \cdot Q_{max} \cdot (SOC_n - SOC_{n-1}) \cdot \left( \frac{R_{0,n}}{t_C} + \sum_{k=1}^{M} \frac{R_{k,n}}{t_C + C_{k,n} \cdot R_{k,n}} \right)$$

$$V_{ocv,n+1} - V_{B,n+1} - \sum_{k=1}^{M} \frac{C_{k,n} \cdot R_{k,n} \cdot C_{k,n+1} \cdot R_{k,n+1} \cdot \Delta_{k,n-1}}{(t_C + C_{k,n+1} \cdot R_{k,n+1}) \cdot (t_C + C_{k,n} \cdot R_{k,n})} = \quad (20)$$

$$-C_{dg} \cdot Q_{max} \cdot (SOC_n - SOC_{n-1}) \cdot \left\{ \frac{R_{0,n+1}}{t_C} + \sum_{k=1}^{M} \left[ \frac{1}{t_C + C_{k,n+1} \cdot R_{k,n+1}} \cdot \left( R_{k,n+1} + \frac{C_{k,n+1} \cdot R_{k,n+1} \cdot R_{k,n}}{t_C + C_{k,n} \cdot R_{k,n}} \right) \right] \right\}$$

Dividing the equation 19 by the equation 20 yields an equation 21:

$$\frac{V_{ocv,n} - V_{B,n} - \sum_{k=1}^{M} \frac{C_{k,n} \cdot R_{k,n} \cdot \Delta_{k,n-1}}{t_C + C_{k,n} \cdot R_{k,n}}}{V_{ocv,n+1} - V_{B,n+1} - \sum_{k=1}^{M} \frac{C_{k,n} \cdot R_{k,n} \cdot C_{k,n+1} \cdot R_{k,n+1} \cdot \Delta_{k,n-1}}{(t_C + C_{k,n+1} \cdot R_{k,n+1}) \cdot (t_C + C_{k,n} \cdot R_{k,n})}} = \quad (21)$$

$$\frac{\frac{R_{0,n}}{t_C} + \sum_{k=1}^{M} \frac{R_{k,n}}{t_C + C_{k,n} \cdot R_{k,n}}}{\frac{R_{0,n+1}}{t_C} + \sum_{k=1}^{M} \left[ \frac{1}{t_C + C_{k,n+1} \cdot R_{k,n+1}} \cdot \left( R_{k,n+1} + \frac{C_{k,n+1} \cdot R_{k,n+1} \cdot R_{k,n}}{t_C + C_{k,n} \cdot R_{k,n}} \right) \right]}$$

With the assumption of the constant current, a relation of $SOC_{n+1} = 2 \cdot SOC_n - SOC_{n-1}$ is obtained. The charging state $SOC_n$ at the time n is determined by applying this relation to the equation 21 and solving $SOC_n$. Returning to the equation 16 and solving $C_{dg}$ yields an equation 22:

$$C_{dg} = \frac{V_{ocv,n} - V_{B,n} - \sum_{k=1}^{M} \frac{C_{k,n} \cdot R_{k,n} \cdot \Delta_{k,n-1}}{t_C + C_{k,n} \cdot R_{k,n}}}{Q_{max} \cdot (SOC_{n-1} - SOC_n) \cdot \left( \frac{R_{0,n}}{t_C} + \sum_{k=1}^{M} \frac{R_{k,n}}{t_C + C_{k,n} \cdot R_{k,n}} \right)} \quad (22)$$

The secular change coefficient $C_{dg}$ is determined by substituting the values determined as $SCO_n$ in the equation 21 into the equation 22.

Although the individual secular change coefficients of the maximum battery capacity $Q_{max}$ and the battery internal resistance $R_k$ are unknown, the secular change coefficient $C_{dg}$ defined as the product of those is determined, thus enabling an accurate remaining power prediction.

In order to recognize the individual secular change coefficients of the maximum battery capacity and the battery internal resistance, there is a need to recognize a current value as a battery current in addition to a constant current property. If the current value is known as $i_C$, the maximum battery capacity and its secular change coefficient are expressed in an equation 23:

$$i_C = C_{Qdg} \cdot Q_{max} \cdot (SOC_{n-1} - SOC_n) / t_C \quad (23)$$

Using the present equation, the secular change coefficient $C_{Qdg}$ of the maximum battery capacity can be determined from an equation 24:

$$C_{Qdg} = \frac{i_C \cdot t_C}{Q_{max} \cdot (SOC_{n-1} - SOC_n)} \quad (24)$$

On the other hand, the secular change coefficient of the battery internal resistance can be obtained in accordance with an equation 25:

$$C_{Rdg} = \frac{C_{dg}}{C_{Qdg}} = \frac{Q_{max} \cdot (SOC_{n-1} - SOC_n)}{i_C \cdot t_C} \cdot C_{dg} = \quad (25)$$

$$\frac{V_{ocv,n} - V_{B,n} - \sum_{k=1}^{M} \frac{C_{k,n} \cdot R_{k,n} \cdot \Delta_{k,n-1}}{t_C + C_{k,n} \cdot R_{k,n}}}{i_C \cdot t_C \cdot \left( \frac{R_{0,n}}{t_C} + \sum_{k=1}^{M} \frac{R_{k,n}}{t_C + C_{k,n} \cdot R_{k,n}} \right)}$$

Using that the battery current is of the constant current as described above enables the secular change to be recognized. If the current value is known in addition to that, it is possible to recognize the secular changes in the maximum battery capacity and the battery internal resistance.

Since there is a need to keep the battery current constant, the secular change coefficients are determined by allowing this state to be set. In order to perform such a setting, it is determined that the application system is stopped or in a standby state, i.e., the current of the application system is in a state of near ~"0". By activating the known constant current source built in the battery remaining power predicting device 1 in this state, the battery can be brought into the known constant current discharging state in which the current value is known, thus making it possible to determine the secular change coefficients by the above-described method.

Next, considering the charged state of the battery, the battery is in a constant current charging state during most of charging periods where the battery is charged. Although the battery state of charge varies from the constant current charge only in a state close to the full charge, at least the presence of the constant current charging state can easily be recognized depending on whether a change in increase/decrease in the battery remaining power and a battery voltage value fall within a prescribed voltage range. By detecting that the battery is in this state, the secular change coefficients can be determined through the aforementioned method. Although the charging current value varies according to each charging device, the charging current value is defined. In such a case, it is possible to recognize by a comparison with a current value calculated from the battery remaining power prediction calculation whether the battery is charged by any prescribed current value. It is possible to determine the individual secular change coefficients of the maximum battery capacity and the battery internal resistance by using the charging current value.

Figure 3:
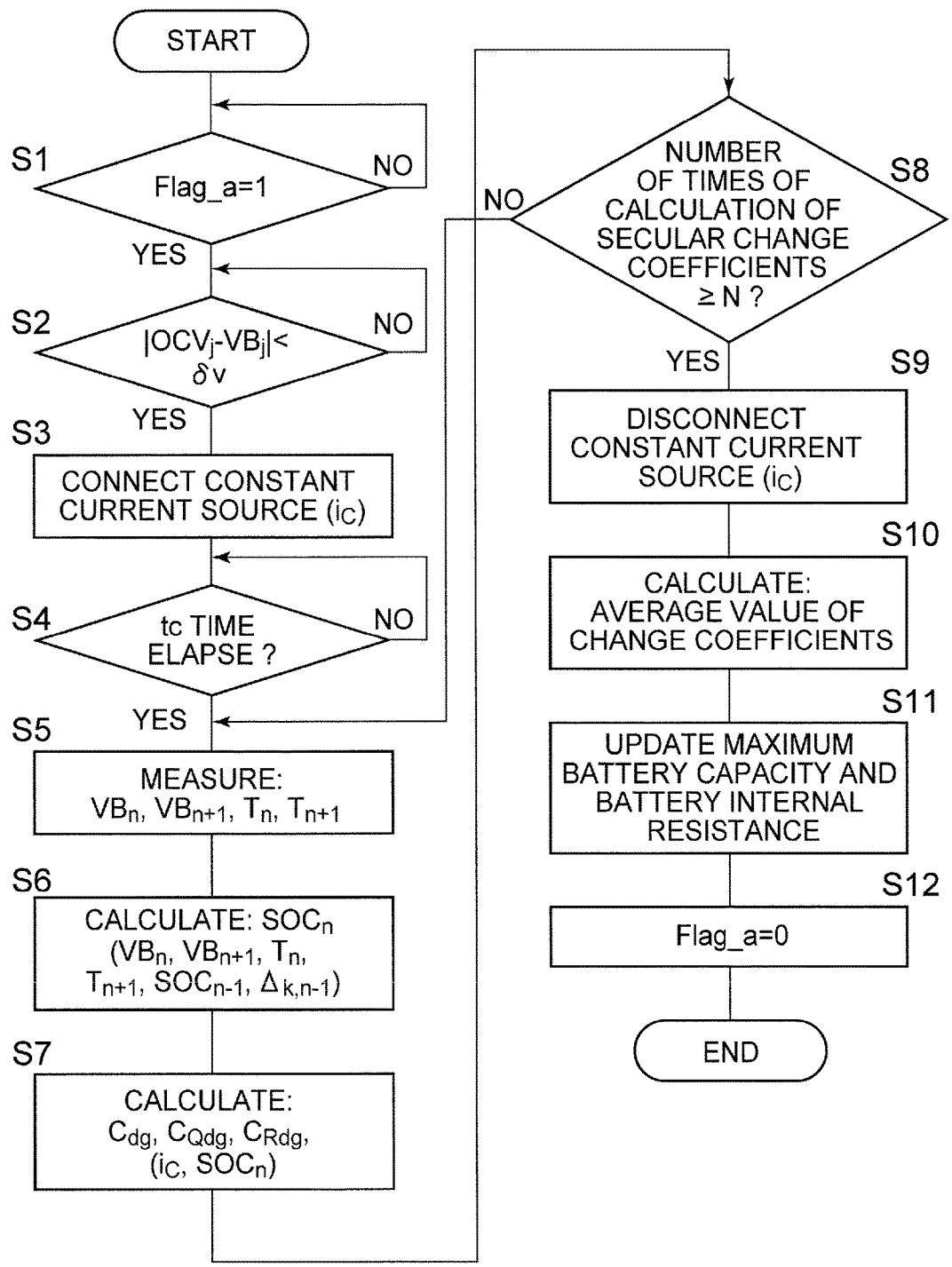
FIG. 3 is a secular change estimating flow of battery characteristics in the battery remaining power predicting device according to the present embodiment.

The above method is illustrated in FIG. 3. FIG. 3 is a secular change estimating flow of battery characteristics in the battery remaining power predicting device 1 according to the present embodiment.

In Step S1, it is determined based on a flag Flag_a whether the battery characteristics estimating flow for recognizing a battery secular change is carried out. It is considered that the flag Flag_a is automatically set depending on whether, for example, a characteristic estimation elapsed time or the number of charging and discharging cycles from the previous time satisfies various conditions provided by control from the outside of the battery remaining power predicting device 1 or within the battery remaining power predicting device 1. When Flag_a is set (set to "1" in the present example), the secular change estimating flow proceeds to Step S2.

In Step S2, it is determined whether the battery current is approximately "0". This relation is determined from a voltage in difference between a battery open circuit voltage $OVC_j$ calculated from the battery remaining power prediction calculation, and a battery terminal voltage $VB_j$ at that time. This relation is determined depending on whether the difference voltage is smaller than a prescribed voltage $\delta$. When the difference voltage becomes smaller than $\delta$, the battery characteristics estimating flow proceeds to Step S3.

In Step S3, the constant current source (current $i_C$) built in the battery remaining power predicting device 1 is connected as a battery load or activated.

In Step S4, after the activation of the constant current source, the battery remaining power predicting device 1 waits for a prescribed time until the operation of the constant current source or the like is stabilized. Incidentally, the standby time may not be provided as the case may be.

In Step S5, the battery voltages $VB_n$ and $VB_{n+1}$, and the battery temperatures $T_n$ and $T_{n+1}$ at the times n and n+1 are measured.

In Step S6, the charging state $SOC_n$ at the time n used in the calculation of the secular change coefficient is regressively calculated on the basis of the charging state $SOC_{n-1}$ and the internal voltage $\Delta_{k,n-1}$ in the battery equivalent circuit model at the time n−1 both obtained from the battery remaining power prediction calculation in addition to the battery voltages and the battery temperatures obtained in Step S5. The equation 21 is used in this calculation.

Upon executing this calculation, a relational equation prepared in advance is assumed to be a battery characteristic equation. The dependence of the battery open circuit voltage on the charging state SOC and the battery temperature T, and the dependence of the battery impedance of the battery equivalent circuit on the charging state SOC and the battery temperature T are assumed to be defined by $V_{ocv}=f_{ocv}(SOC, T)$, $R_k=f_{Rk}(SOC, T)$ (where k≥0), and $C_k=f_{Ck}(SOC, T)$ (where k≥1). When it is not possible to represent these equations algebraically, they are defined as a numeral table. When they are applied to the equation 21, they are expressed in an equation 26:

$$\frac{f_{ocv}(SOC_n, T_n) - V_{B,n} - \sum_{k=1}^{M} \frac{\Delta_{k,n-1}}{t_C/\tau_k(SOC_n, T_n) + 1}}{f_{ocv}(SOC_{n+1}, T_{n+1}) - V_{B,n+1} - \sum_{k=1}^{M} \frac{\Delta_{k,n-1}}{(t_C/\tau_k(SOC_n, T_n) + 1) \cdot (t_C/\tau_k(SOC_{n+1}, T_{n+1}) + 1)}}$$

$$\frac{\frac{f_{R0}(SOC_n, T_n)}{t_C} + \sum_{k=1}^{M} \frac{f_{Rk}(SOC_n, T_n)}{t_C + \tau_k(SOC_n, T_n)}}{\frac{f_{R0}(SOC_{n+1}, T_{n+1})}{t_C} + \sum_{k=1}^{N} \left[ \frac{1}{t_C + \tau_k(SOC_{n+1}, T_{n+1})} \cdot \left( f_{Rk}(SOC_{n+1}, T_{n+1}) + \frac{\tau_k(SOC_{n+1}, T_{n+1}) \cdot f_{Rk}(SOC_n, T_n)}{t_C + \tau_k(SOC_n, T_n)} \right) \right]} \quad (26)$$

Now, the following congruent form is assumed to be established as follows: $\tau_k(SOC_n, T_n) \equiv f_{ck}(SOC_n, T_n) \cdot f_{Rk}(SOC_n, T_n)$.

The charging state $SOC_n$ is regressively calculated with $SOC_{n+1} = 2 \cdot SOC_n - SOC_{n-1}$ being taken as a condition in the present expression.

In Step S7, the secular change coefficients $C_{dg}$, $C_{Qdg}$, and $C_{Rdg}$ of the battery characteristics are calculated based on the charging state $SOC_n$ obtained in Step S6. The battery current used upon the calculation is the known current $i_C$ of the constant current source 4 built in the battery remaining power predicting device 1.

In Step S8, counting is executed up to the number N of times at which the flows from Step S5 to Step S7 are repeated.

In Step S9, the constant current source 4 built in the battery remaining power predicting device 1 is disconnected from the battery 7 or deactivated.

In Step S10, the average value of the respective secular change coefficients is calculated.

In Step S11, the maximum battery capacity and the battery internal impedance used in the battery remaining power prediction calculation are updated.

In the last Step S12, the battery characteristic estimation Flag_a is cleared ("0" in the present example), and the present flow is terminated.

As described above, according to the method of accurately estimating the secular change in the battery characteristics by using the current $i_C$ of the constant current source 4 in the present invention, it is possible to provide the battery remaining power predicting device 1 capable of highly accurately predicting the battery remaining power.

Figure 4:
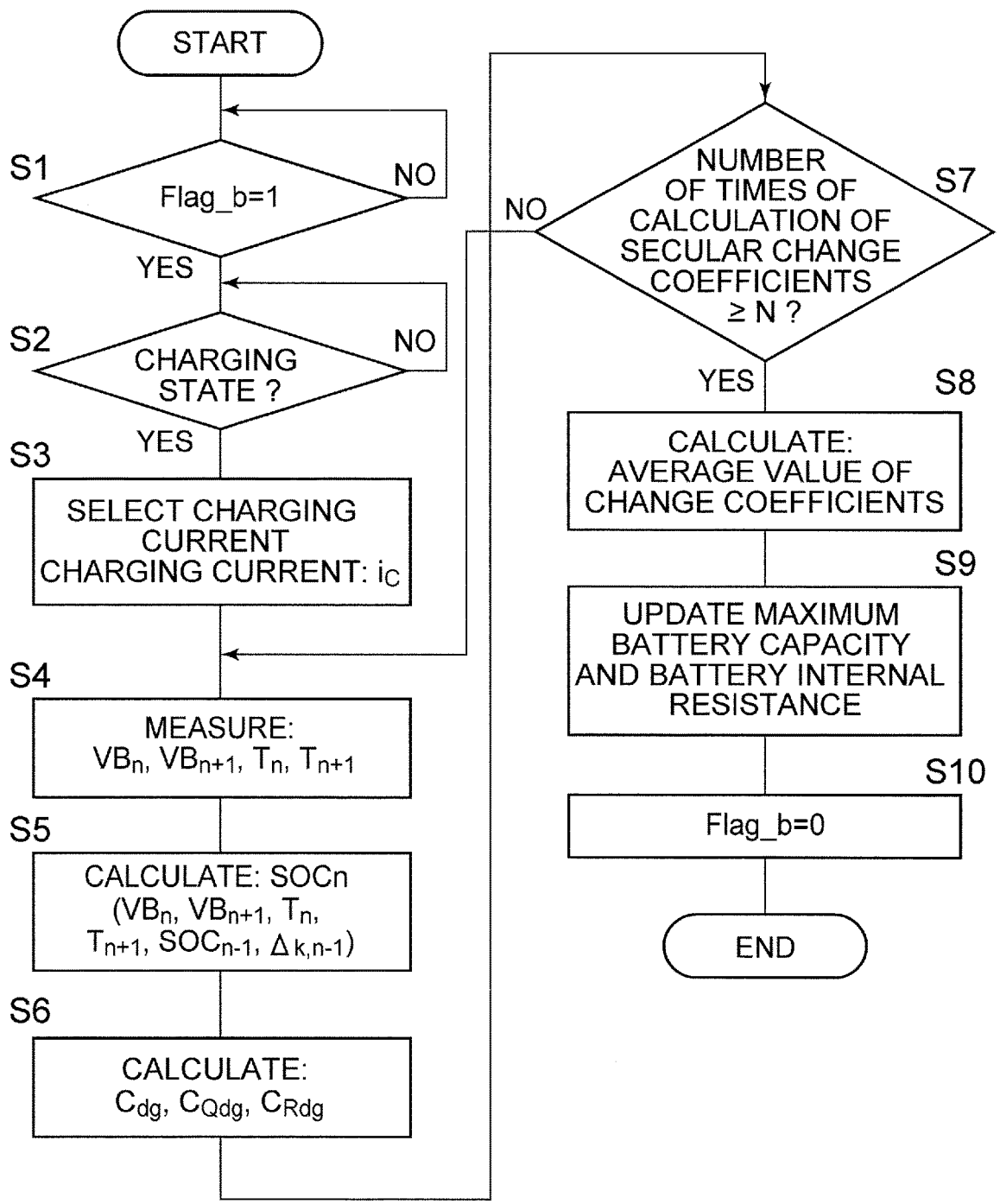
FIG. 4 is another example of the secular change estimating flow of the battery characteristics in the battery remaining power predicting device according to the present embodiment.

Incidentally, the above-described flow determines the secular change coefficients of the battery characteristics by the provision of the constant current source 4 and utilizing the current $i_C$ from the constant current source 4. A method of determining the secular change coefficients of the battery characteristics in the battery remaining power predicting device 1 having no constant current source 4 will be described below using a secular change estimating flow of battery characteristics illustrated in FIG. 4. That is, the battery remaining power predicting device 1 is provided with no constant current sources 4 and switch 5.

In Step S1, it is determined based on a flag Flag_b whether a battery characteristic estimation for recognizing a secular change in the rechargeable battery 7 is executed. It is considered that the flag Flag_b is automatically set by control from the outside of the battery remaining power predicting device 1 or depending on whether various conditions provided within the battery remaining power predicting device 1, such as a characteristic estimation time, the number of charging and discharging cycles from the previous time, etc. are cleared. When Flag_b is set (set to "1" in the present example), the secular change estimating flow proceeds to Step S2.

In Step S2, it is determined whether the rechargeable battery is in a charging state. The charging state SOC is determined from a battery remaining power prediction calculation. Since, however, the charging state SOC increases when the rechargeable battery is in the charging state, it is possible to determine from a change in the charging state SOC whether the rechargeable battery is in the charging state. Alternatively, it is also possible to carry out the setting of the charging state even by control from the outside of the battery remaining power predicting device 1. When the rechargeable battery is determined to be in the charging state, the secular change estimating flow proceeds to Step S3.

In Step S3, a constant current value of a charging current is selected. Although the charging current may vary according to each charging device, the charging current is defined every charging device. It is considered that the current determined in the process of the battery remaining power prediction calculation is compared with prescribed current values of a plurality of charging devices, and the prescribed current value close to the current is selected as a charging current $i_C$.

Since Steps S4 to S7 are similar to Steps S5 to S8 of FIG. 3, the description thereof will be omitted.

In Step S8, the average value of the secular change coefficients of the battery characteristics is calculated.

In Step S9, the maximum battery capacity and the battery internal impedance used in the battery remaining power prediction calculation are updated.

In Step S10, the flag Flag_b is cleared (Flag_b="0" in the present example), and the flow is terminated.

There can be provided the battery remaining power predicting device 1 capable of highly accurately predicting the battery remaining power even by the method of accurately estimating the secular change in the battery characteristics, utilizing the charging current in the present invention.

Figure 5:
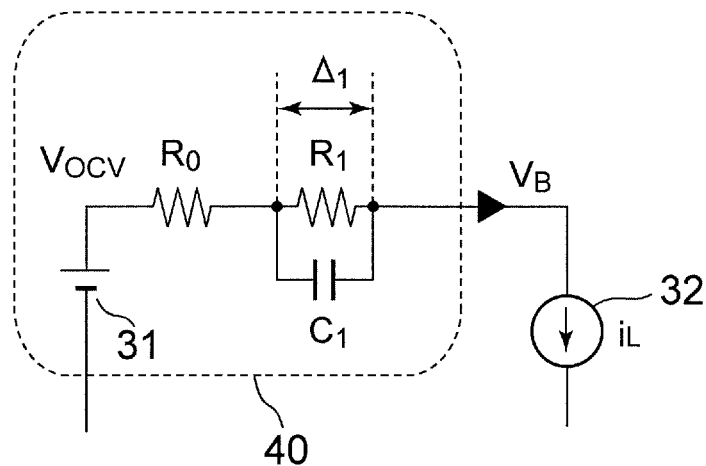
FIG. 5 is a circuit diagram illustrating a simplified equivalent circuit model of a battery.

Incidentally, according to the flows described so far, the estimation calculation is done on the basis of the general battery equivalent circuit model illustrated in FIG. 2. It is however possible to estimate the secular change coefficients indicative of the secular change in the battery characteristics even by using a simplified battery equivalent circuit model illustrated in FIG. 5. The simplified battery equivalent circuit model is configured with a circuit of C and R connected in parallel as only one set. Assuming M=1 in the equations 5 and 6, equations 27 and 28 are obtained:

$$i_L \cdot C_{Rdg} \cdot R_1 = \Delta_1 + C_{Cdg} \cdot C_{Rdg} \cdot R_1 \cdot C_1 \cdot \frac{\partial}{\partial t}\Delta_1 \tag{27}$$

$$V_{ocv} - VB = i_L \cdot C_{Rdg} \cdot R_0 + \Delta_1 \tag{28}$$

Determining $\Delta_1$ from the equation 28, and substituting the same into the equation 27 and rearranging the resulting equation yields an equation 29:

$$V_{ocv} - V_B - i_L \cdot C_{Rdg} \cdot (R_0 + R_1) + C_1 \cdot R_1 \cdot \frac{\partial}{\partial t}(V_{ocv} - V_B) - \tag{29}$$
$$C_1 \cdot R_1 \cdot C_{Rdg} \cdot i_L \cdot \frac{\partial}{\partial t}R_0 - C_1 \cdot R_1 \cdot C_{Rdg} \cdot R_0 \cdot \frac{\partial}{\partial t}i_L = 0$$

When the differential equation expressed in the equation 29 is subjected to difference approximations at the times n and n−1, it can be expressed in an equation 30:

$$(V_{ocv,n} - V_{B,n}) \cdot \left(1 + \frac{C_{1,n} \cdot R_{1,n}}{t_C}\right) - C_{1,n} \cdot R_{1,n} \cdot \frac{V_{ocv,n-1} - V_{B,n-1}}{t_C} = \tag{30}$$
$$i_{L,n} \cdot C_{Rdg} \cdot \left(R_{0,n} + R_{1,n} + \frac{R_{0,n} - R_{0,n-1}}{t_C} \cdot C_{1,n} \cdot R_{1,n}\right) +$$
$$\frac{i_{L,n} - i_{L,n-1}}{t_C} \cdot C_{1,n} \cdot R_{1,n} \cdot C_{Rdg} \cdot R_{0,n}$$

The constant current discharge or the constant current charge is assumed as with the previous assumption to determine the secular change coefficients of the battery characteristics, based on the equation 30. Since $i_{L,n} = i_{L,n-1}$ can be reached by this assumption, the equation 30 yields an equation 31:

$$(V_{ocv,n} - V_{B,n}) \cdot \left(1 + \frac{C_{1,n} \cdot R_{1,n}}{t_C}\right) - C_{1,n} \cdot R_{1,n} \cdot \frac{V_{ocv,n-1} - V_{B,n-1}}{t_C} = \tag{31}$$
$$i_{L,n} \cdot C_{Rdg} \cdot \left(R_{0,n} + R_{1,n} + \frac{R_{0,n} - R_{0,n-1}}{t_C} \cdot C_{1,n} \cdot R_{1,n}\right)$$

Substituting a current $i_{L,n}$ expressed in an equation 32 into the equation 31 yields an equation 33:

$$i_{L,n} = -C_{Qdg} \cdot Q_{max} \cdot \frac{SOC_n - SOC_{n-1}}{t_C} \tag{32}$$

$$(V_{ocv,n} - V_{B,n}) \cdot (t_C + C_{1,n} \cdot R_{1,n}) - (V_{ocv,n-1} - V_{B,n-1}) \cdot C_{1,n} \cdot R_{1,n} = \tag{33}$$
$$-C_{dg} \cdot Q_{max} \cdot (SOC_n - SOC_{n-1}) \cdot$$
$$\left(R_{0,n} + R_{1,n} + \frac{R_{0,n} - R_{0,n-1}}{t_C} \cdot C_{1,n} \cdot R_{1,n}\right)$$

When an equation is set up even at the time n+1 on the basis of the above equation, the equation can be expressed in an equation 34:

$$(V_{ocv,n+1} - V_{B,n+1}) \cdot (t_C + C_{1,n+1} \cdot R_{1,n+1}) - \tag{34}$$
$$(V_{ocv,n} - V_{B,n}) \cdot C_{1,n+1} \cdot R_{1,n+1} = -C_{dg} \cdot Q_{max} \cdot (SOC_{n+1} - SOC_n) \cdot$$
$$\left(R_{0,n+1} + R_{1,n+1} + \frac{R_{0,n+1} - R_{0,n}}{t_C} \cdot C_{1,n+1} \cdot R_{1,n+1}\right)$$

Dividing the equation 33 by the equation 34 according to the assumption of the constant current as $SOC_n - SOC_{n-1} = SOC_{n+1} - SOC_n$ yields the following:

$$\frac{(V_{ocv,n} - V_{B,n}) \cdot (t_C + C_{1,n} \cdot R_{1,n}) -}{(V_{ocv,n+1} - V_{B,n+1}) \cdot (t_C + C_{1,n+1} \cdot R_{1,n+1}) -} = \tag{35}$$
$$\frac{(V_{ocv,n-1} - V_{B,n-1}) \cdot C_{1,n} \cdot R_{1,n}}{(V_{ocv,n} - V_{B,n}) \cdot C_{1,n+1} \cdot R_{1,n+1}}$$

$$\frac{R_{0,n} + R_{1,n} + \frac{R_{0,n} - R_{0,n-1}}{t_C} \cdot C_{1,n} \cdot R_{1,n}}{R_{0,n+1} + R_{1,n+1} + \frac{R_{0,n+1} - R_{0,n}}{t_C} \cdot C_{1,n+1} \cdot R_{1,n+1}}$$

An equation 36 is established from the assumption of the constant current.

$$SOC_{n+1} = 2 \cdot SOC_n - SOC_{n-1} \quad (36)$$

The charging state $SOC_n$ at the time n is calculated by a regressive method using the above equations 35 and 36. The secular change coefficients of the battery characteristics $C_{dg}$, $C_{Qdg}$, and $C_{Rdg}$ can respectively be determined by the following equations using the determined charging state $SOC_n$:

$$C_{dg} = -\frac{(V_{ocv,n} - V_{B,n}) \cdot (t_C + C_{1,n} \cdot R_{1,n}) - (V_{ocv,n-1} - V_{B,n-1}) \cdot C_{1,n} \cdot R_{1,n}}{Q_{max} \cdot (SOC_n - SOC_{n-1}) \cdot \left(R_{0,n} + R_{1,n} + \frac{R_{0,n} - R_{0,n-1}}{t_C} \cdot C_{1,n} \cdot R_{1,n}\right)} \quad (37)$$

$$C_{Qdg} = \frac{i_C \cdot t_C}{-Q_{max} \cdot (SOC_n - SOC_{n-1})} \quad (38)$$

$$C_{Rdg} = \frac{C_{dg}}{C_{Qdg}} = \frac{-Q_{max} \cdot (SOC_n - SOC_{n-1})}{i_C \cdot t_C} \cdot C_{dg} = \frac{(V_{ocv,n} - V_{B,n}) \cdot (t_C + C_{1,n} \cdot R_{1,n}) - (V_{ocv,n-1} - V_{B,n-1}) \cdot C_{1,n} \cdot R_{1,n}}{i_C \cdot t_C \cdot \left(R_{0,n} + R_{1,n} + \frac{R_{0,n} - R_{0,n-1}}{t_C} \cdot C_{1,n} \cdot R_{1,n}\right)} \quad (39)$$

Figure 6:
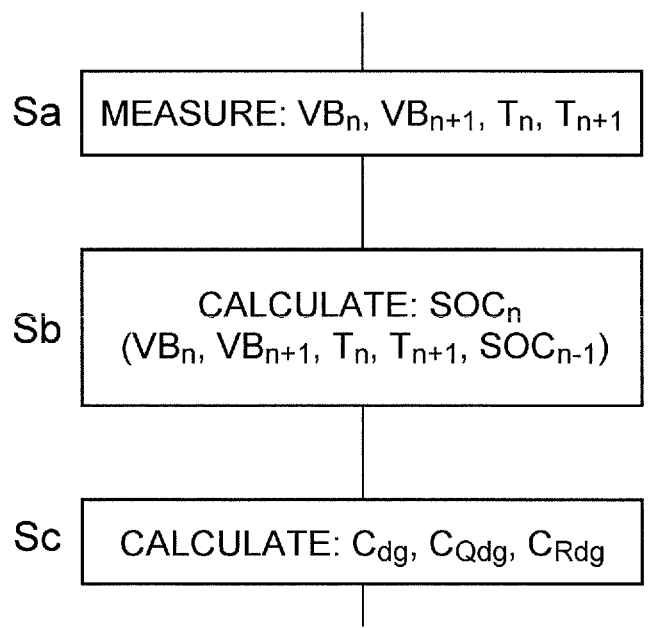
FIG. 6 is a flow for measurement and calculation parts of the secular change estimating flow of the battery characteristics corresponding to the simplified equivalent circuit model of the battery in the battery remaining power predicting device according to the present embodiment.
Figure 7:
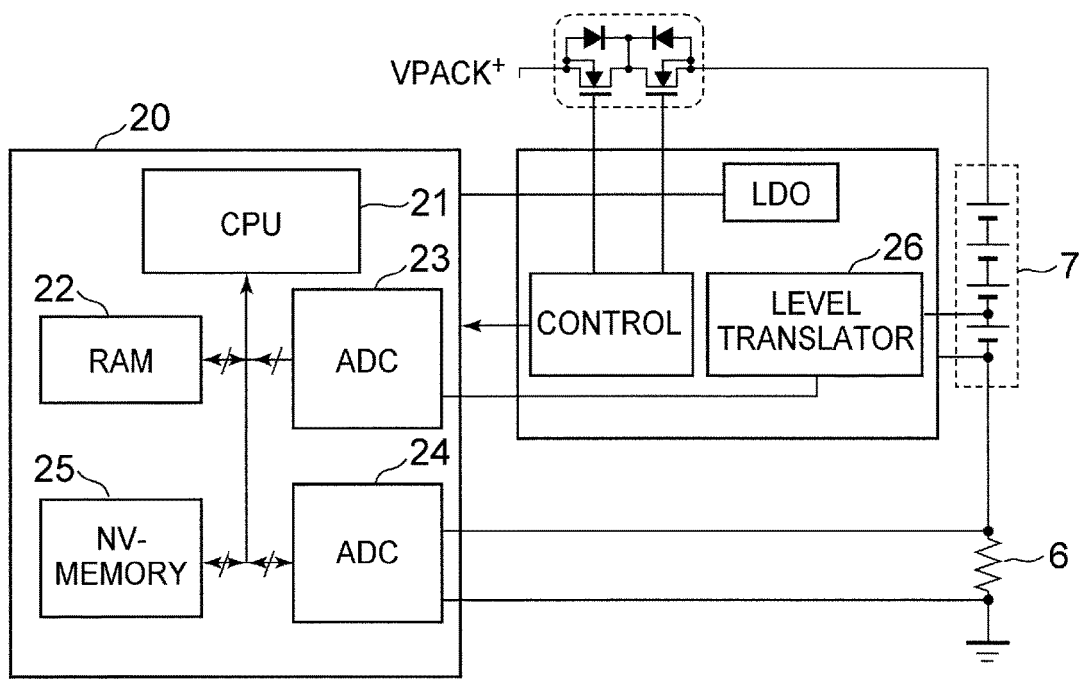
FIG. 7 is a block diagram of a battery pack equipped with a related art battery remaining power predicting device.

The above method is illustrated in FIG. 6. Steps Sa to Sc in FIG. 6 respectively correspond to Steps S4 to S7 in FIG. 3 and Steps S4 to S6 in FIG. 4.

The feature of this flow resides in that in Step Sb, the charging state $SOC_n$ at the time n is determined on the basis of the battery voltages $VB_n$ and $VB_{n+1}$ and battery temperatures $T_n$ and $T_{n+1}$ at the times n and n+1, and the charging state $SCO_{n-1}$ at the time n−1.

According to such a flow as described above, it is possible to estimate secular change coefficients indicative of a secular change in battery characteristics even if the simplified battery equivalent circuit model is used.

As described above, according to the method for accurately estimating the secular change in the battery characteristics in the present invention, there can be provided the battery remaining power predicting device 1 capable of highly accurately predicting the battery remaining power.

Further, since the battery remaining power prediction calculation and the secular change estimation calculation of the battery characteristics are performed in binary number calculations, it becomes easy to achieve a reduction in the logic scale of the calculations by setting a computation time interval to $2^N$ (where N: integer) seconds. Converting the device into an integrated circuit is effective for a reduction in the chip size of the integrated circuit.

What is claimed is:

1. A battery remaining power predicting device configured to measure a voltage and a temperature of a rechargeable battery and to predict a remaining power of the rechargeable battery, the device comprising:
   a voltage detection portion that measures the voltage and temperature of the rechargeable battery;
   a computing portion that predicts and calculates the remaining power of the rechargeable battery, based on the voltage and the temperature; and
   a controller that controls an operation of the battery remaining power predicting device and the computing portion,
   wherein the controller executes a battery remaining power predicting flow for predicting and calculating the remaining power of the rechargeable battery, the battery remaining power prediction flow regressively calculating the battery remaining power, based on the measured voltage and temperature and a battery internal impedance in a battery equivalent circuit, and
   the controller executes a secular change estimating flow for estimating a secular change in battery characteristics using a case where a battery current is in a constant current state.

2. The battery remaining power predicting device according to claim 1, wherein the battery equivalent circuit comprises:
   a voltage source that outputs a battery open circuit voltage,
   a first resistor connected in series with the voltage source, and
   an internal impedance including an impedance element connected in series with the first resistor and having a resistor and a capacitor connected in parallel.

3. The battery remaining power predicting device according to claim 2, wherein the controller executes the secular change estimating flow to:
   determine whether the battery characteristics are in a measurable state,
   determine that the rechargeable battery is in a charging state,
   measure a battery voltage and a battery temperature at a first time, and a battery voltage and a battery temperature after a unit time from the first time,
   regressively calculate a battery remaining power at the first time, based on the measured battery voltage and temperature at the first time, the measured battery voltage and temperature after the unit time from the first time, a battery remaining power before the unit time from the first time, and a voltage applied across the impedance element,
   estimate secular change coefficients of the battery characteristics using the battery remaining power,
   determine whether the estimation of the secular change coefficients is executed a prescribed number of times,
   calculate an average value of the secular change coefficients, and
   determine a secular change in the battery characteristics from the average value of the secular change coefficients and updates an estimated value of the secular change in the battery characteristics.

4. The battery remaining power predicting device according to claim 2, comprising a constant current source as a battery load,
   wherein when the controller determines that an operating current of a system operated by the rechargeable battery is in a state of not greater than a prescribed current, the control portion activates the constant current source to bring the battery current to a constant current state, and thereafter measures the battery voltage and the battery temperature and estimates the secular change in the battery characteristics.

5. The battery remaining power predicting device according to claim 4, wherein the controller executes the secular change estimating flow to:
  determine whether the battery characteristics are in a measurable state,
  set the constant current source as a battery load when the battery characteristics are in the measurable state,
  and the calculating portion measures the elapse of a prescribed time,
  after the prescribed time elapses, measure a battery voltage and a battery temperature at a first time, and a battery voltage and a battery temperature after a unit time from the first time,
  regressively calculate a battery remaining power at the first time, based on the measured battery voltage and temperature at the first time, the measured battery voltage and temperature after the unit time from the first time, a battery remaining power before the unit time from the first time, and a voltage applied across the impedance element,
  estimate secular change coefficients of the battery characteristics using the battery remaining power,
  determine whether the estimation of the secular change coefficients is executed a prescribed number of times,
  disconnect the constant current source from the rechargeable battery when the estimation is executed the prescribed number of times,
  calculate an average value of the secular change coefficients, and
  calculate a secular change in the battery characteristics from the average value of the secular change coefficients and update an estimated value of the secular change in the battery characteristics.

6. The battery remaining power predicting device according to claim 1, wherein the internal impedance of the battery equivalent circuit comprises a plurality of the impedance elements connected in series.

7. The battery remaining power predicting device according to claim 6, wherein the control portion executes the secular change estimating flow to:
  determine whether the battery characteristics are in a measurable state,
  determine that the rechargeable battery is in a charging state,
  measure a battery voltage and a battery temperature at a first time, and a battery voltage and a battery temperature after a unit time from the first time,
  regressively calculate a battery remaining power at the first time, based on the measured battery voltage and temperature at the first time, the measured battery voltage and temperature after the unit time from the first time, and a battery remaining power before the unit time from the first time,
  estimate secular change coefficients of the battery characteristics using the battery remaining power,
  determine whether the estimation of the secular change coefficients is executed a prescribed number of times,
  calculate an average value of the secular change coefficients, and
  calculate a secular change in the battery characteristics from the average value of the secular change coefficients and updates an estimated value of the secular change in the battery characteristics.

8. The battery remaining power predicting device according to claim 6, comprising a constant current source as a battery load,
  wherein when the controller determines that an operating current of a system operated by the rechargeable battery is in a state of not greater than a prescribed current, the controller activates the constant current source to bring the battery current to a constant current state, and thereafter measures the battery voltage and the battery temperature and estimates the secular change in the battery characteristics.

9. The battery remaining power predicting device according to claim 8, wherein the controller executes the secular change estimating flow to:
  determine whether the battery characteristics are in a measurable state,
  set the constant current source as a battery load when the battery characteristics are in the measurable state,
  measure the elapse of a prescribed time,
  after the prescribed time elapses, measure a battery voltage and a battery temperature at a first time, and a battery voltage and a battery temperature after a unit time from the first time,
  regressively calculate a battery remaining power at the first time, based on the measured battery voltage and temperature at the first time, the measured battery voltage and temperature after the unit time from the first time, and a battery remaining power before the unit time from the first time,
  estimate secular change coefficients of the battery characteristics using the battery remaining power,
  determine whether the estimation of the secular change coefficients is executed a prescribed number of times,
  disconnect the constant current source from the rechargeable battery when the estimation is executed the prescribed number of times,
  calculate an average value of the secular change coefficients, and
  calculate a secular change in the battery characteristics from the average value of the secular change coefficients and update an estimated value of the secular change in the battery characteristics.

10. The battery remaining power predicting device according to claim 1, wherein a time interval at which a battery remaining power prediction computation is performed is assumed to be 2N (where N: integer) seconds.

11. A battery pack comprising:
  a rechargeable battery and a MOSFET for load current control connected in series between first and second external terminals to which a load is connected;
  a control circuit which is connected across the rechargeable battery and which monitors a state of the rechargeable battery and controls the MOSFET; and
  the battery remaining power predicting device according to claim 1, which is connected across the rechargeable battery and predicts a remaining power of the rechargeable battery.

* * * * *